United States Patent [19]
Kim et al.

[11] Patent Number: 5,329,376
[45] Date of Patent: Jul. 12, 1994

[54] VCR CONTROL OF A CABLE CONVERTER UNIT WITH ACTIVE SIGNAL DETECTION

[75] Inventors: Sung Jo Kim, Fishers; Alfred J. Schick; John H. Furrey, both of Indianapolis, all of Ind.

[73] Assignee: Thomson Consumer Electronics, Inc., Indianapolis, Ind.

[21] Appl. No.: 160,759

[22] Filed: Dec. 3, 1993

Related U.S. Application Data

[62] Division of Ser. No. 807,472, Dec. 13, 1991, Pat. No. 5,303,063.

[51] Int. Cl.⁵ .......................... H04N 5/50; H04N 5/76
[52] U.S. Cl. .................................. 358/335; 348/731; 348/734; 360/79
[58] Field of Search .................. 360/79; 348/731, 734; 358/335; H04N 5/50, 5/76

[56] References Cited

U.S. PATENT DOCUMENTS

| | | | |
|---|---|---|---|
| 4,841,368 | 6/1989 | Rumbolt | 348/734 |
| 5,123,046 | 6/1992 | Levine | 348/734 |
| 5,151,789 | 9/1992 | Young | 348/731 |

Primary Examiner—Mark R. Powell
Attorney, Agent, or Firm—Joseph S. Tripoli; Peter M. Emanuel; Thomas F. Lenihan

[57] ABSTRACT

A VCR includes circuitry for controlling a cable converter unit, circuitry for detecting the presence of a television signal, and control code transmission means for remotely controlling a cable converter unit. Advantageously, because the VCR is coupled to the output of the cable converter unit, the VCR can monitor the television signals received from the cable converter unit to ensure that commands sent to the cable converter unit from the VCR are executed. In one embodiment, infrared (IR) transmission of commands from the VCR to the cable converter unit is employed.

5 Claims, 6 Drawing Sheets

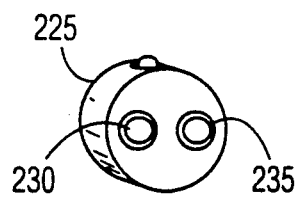 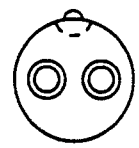 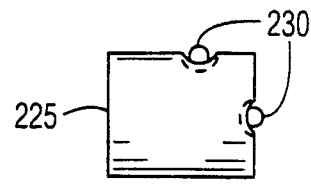
FIG. 2c   FIG. 2d   FIG. 2e
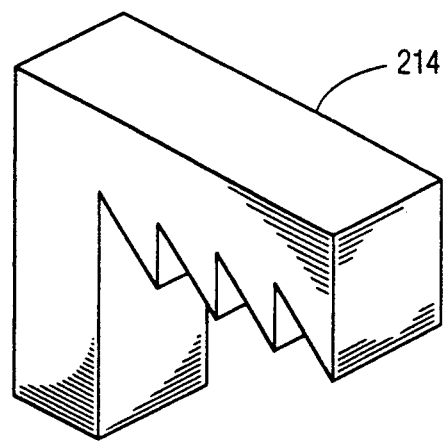
FIG. 2f
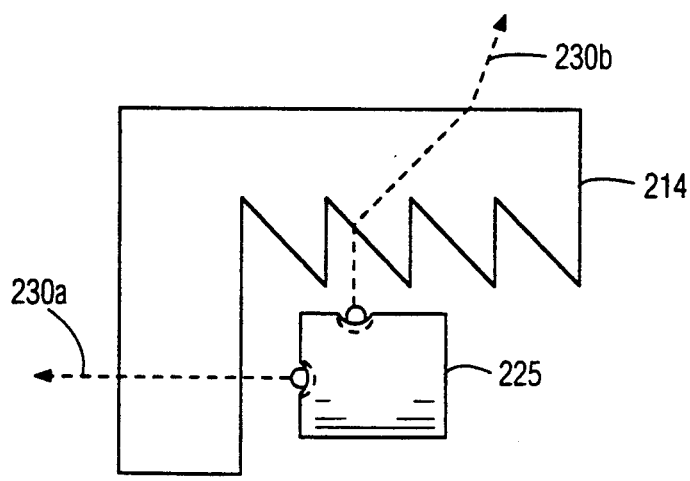
FIG. 2g

VCR CONTROL OF A CABLE CONVERTER UNIT WITH ACTIVE SIGNAL DETECTION

This is a division of application Ser. No. 07/807,472, filed Dec. 13, 1991 now U.S. Pat. No. 5,303,063.

FIELD OF THE INVENTION

The subject application concerns the field of videocassette recorders (VCRs) and apparatus for programming them.

CROSS REFERENCE TO RELATED APPLICATIONS

The subject patent application is related to U.S. patent applications bearing Ser. Nos. 694,310, 695,025, and 695,026, filed May 2, 1991, and 704,418 and 704,419, filed May 22, 1991, and to application number 806,916 filed herewith, and assigned to the same assignee as the subject invention.

BACKGROUND OF THE INVENTION

It is generally believed that many, if not the vast majority, of people are simply unable to program their VCRs to record a desired television program on a given channel, at a given time and data. VCR manufacturers have provided different programming schemes in an attempt to address this undesirable situation, with little success.

Early VCRs such as the VET 650 manufactured by RCA Corporation, Indianapolis, Ind., were programmed by means of pushbuttons mounted on the front panel of the VCR. The pushbuttons controlled the entry of time-on, time-off, data, and channel number data. Feedback was provided to the user by means of a front-panel-mounted LED (light emitting diode) display. While such systems accomplished the programming task, they were not perceived as being user-friendly.

Later VCRs such as the Panasonic model PV-4800 manufactured by Panasonic Company, Division of Matsushita Electric Corporation of America, Secaucus, N.J., provided on-screen programming in an effort to make programming the VCR a less intimidating and confusing task. Nonetheless, users may still be confused by the numerous programming steps involved.

Panasonic VCR model PV-2812 employs a bar-code reader for programming the recording of television shows. In this system, a user draws a bar-code reader across the appropriate codes printed on a bar-code sheet. This solution is considered inadequate for several reasons. First, most newspapers do not print television schedule bar-codes. Second, such printed bar-code sheets tend to be relatively large pieces of paper which should be stored in a place, presumably near the VCR, where they will be readily available for programming. Third, the user must use yet another piece of equipment (i.e., the bar-code reader) in order to read-in the code for his desired television show.

When the user is a subscriber to a cable television system, his confusion concerning VCR programming may be greatly multiplied, because it is common practice in cable television systems to translate programs from their normal "air" channel to a different "cable" channel. For example, a television program broadcast on channel 29 may be received by a cable television subscriber on cable channel 09. Thus, when the channel listed in the channel guide of the local newspaper is not the channel upon which the desired television show is actually conveyed by the user's cable TV service, the VCR programming task may appear insurmountable.

Recently, a programming simplification system known as VCR PLUS TM, manufactured by Gemstar Development Corporation, Pasadena, Calif., has become available. Briefly, the apparatus of the VCR PLUS TM system resembles a standard remote control handunit. The handunit is preprogrammed with the codes for controlling the VCRs and cable control boxes of many manufacturers. The handunit is then programmed by the user with a unique code comprising 1 to 8 digits, which code corresponds to a particular television show broadcast on a given channel, at a given time and date, and having a given duration. A television shown which is broadcast at the most popular viewing time (for example, 7 pm) may have a code which comprises only 1 digit. Conversely, a television show which is broadcast at the least popular viewing time (for example, 3 am) may have a code which comprises the full 8 digits. These codes are printed in the channel guide section of the viewer's local newspaper along with the normal time and channel information. After entering the unique 1 to 8 digit code for a particular television show to be recorded, the user places the handunit in a cradle mounted on his VCR to ensure that the handunit is in the proper orientation for transmitting data to the IR (infrared) receiver of the VCR and to the cable box. At the proper time, the VCR PLUS TM handunit transmits IR codes to the cable box to turn it on and tune it to the desired channel, and to the VCR to turn it on and program it to record the desired television show.

While at first glance, it appears that the VCR PLUS TM system solves the consumer's VCR-programming confusion problem, a significant problem remains. If the user is a cable television subscriber, the VCR PLUS TM system has no way of knowing which broadcast channels are assigned to which cable channels of the user's particular cable service. Thus, to use the same example as given above, a user who is a cable television subscriber must perform a channel-mapping procedure to inform the VCR PLUS TM handunit that channel 29 is actually received on cable channel 09. The VCR PLUS TM system provides a method of selecting each of its channel-programming positions to effect this one-time channel-mapping procedure. However, the task of selecting each position for channel-mapping is in itself somewhat confusing and time-consuming.

Copending U.S. patent application Ser. No. 695,026 discloses a programming system built into a VCR which includes VCR PLUS TM capability and autoprogramming capability. That application recognized that the channel-mapping procedure may be greatly simplified by using the autoprogramming feature to locate and program all active channels, and then by mapping in a channel guide list only those channels which are active, instead of requiring the user to select all 125 possible channel-programming positions.

There is a further problem that is encountered when users attempt to record a television show from some cable television systems in that these cable television systems require the use of a receiver unit, normally referred to as a cable box, or set-top converter. In these systems, many cable channels (i.e., the so-called premium channels) are scrambled (i.e., encoded or encrypted) and must be descrambled (i.e., decoded or decrypted) in the cable box. The cable box descrambles the premium channel and converts its RF carrier frequency from its assigned cable channel frequency to a cable box output frequency, normally that of channel 2, 3, 4, or 5. Thus, if the VCR of U.S. patent application Ser. No. 695,026 were directly connected to the incoming cable, and if cable channel 40 were a scrambled premium channel, programming the VCR to record cable channel 40 would cause the VCR to record a scrambled signal. That is, the usable, descrambled version of cable channel 40 only appears at the output of the cable box on one of channels 2, 3, 4, or 5. Unfortunately, if that VCR were to be coupled to the cable box directly, then the ability to tune and record all non-scrambled cable channels would be lost, because the VCR has no control over the cable box channel selection circuitry, unlike the VCR PLUS TM handunit.

Copending U.S. patent application Ser. No. 704,418 recognized that when a user has access to a cable system via a cable box, and to the cable system directly, that the VCR PLUS TM channel mapping feature may be automatically performed for premium channels from the cable box, thus simplifying the programming even more. Unfortunately, even with the system of Copending U.S. patent application Ser. No. 704,418, programs from two different premium channels cannot be recorded in sequence because that VCR cannot cause a channel change in the cable converter box.

SUMMARY OF THE INVENTION

A VCR includes means for controlling a cable converter unit, means for detecting the presence of a television signal, and control code transmission means for remotely controlling a cable converter unit. Advantageously, because the VCR is coupled to the output of the cable converter unit, the VCR can monitor the television signals received from the cable converter unit to ensure that commands sent to the cable converter unit from the VCR are executed. In one embodiment, infrared (IR) transmission of commands from the VCR to the cable converter unit is employed.

BRIEF DESCRIPTION OF THE DRAWING

FIGS. 2c-2g are illustrations showing an IR LED assembly in accordance with the invention.

DETAILED DESCRIPTION OF THE EMBODIMENT

Figure 1:
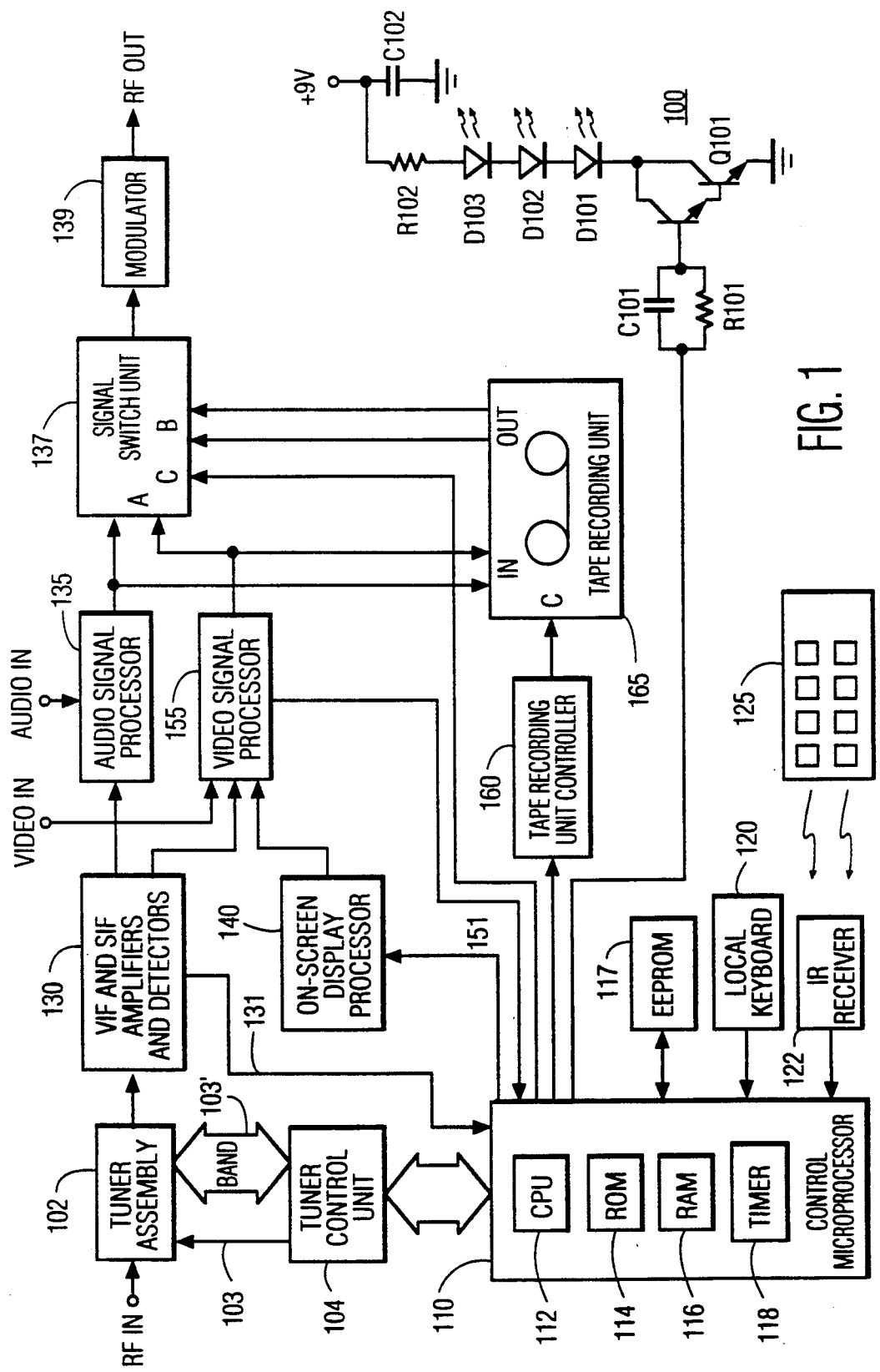
FIG. 1 shows, in block diagram form, a VCR incorporating the subject invention.

Referring to FIG. 1, radio frequency (RF) signals are applied to an RF input terminal of a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, a random access memory 116, and reads data from an external electrically-erasable read only memory (EEPROM) 117. Controller 110 generates a control signal for causing tuner control unit 104 to control tuner 102 to select a particular RF signal, in response to user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a first baseband composite video signal (TV), and a sound carrier signal. The sound carrier signal is applied to an audio signal processor unit 135 which includes an audio detector and may include a stereo decoder. Audio signal processor unit 135 produces a first baseband audio signal and applies it to a signal switch unit 137. Second baseband composite video signals and second baseband audio signals may be applied to VIDEO IN and AUDIO IN terminals from an external source.

The first and second baseband video signals (TV) are coupled to a video processor unit 155 (having a selection circuit not shown) and is also applied to signal switch unit 137. Video and audio signals are also applied to a tape recorder unit 165 which causes the signals to be recorded onto video tape. Tape recorder unit 165 has a control input and operates under control of a tape recorder unit controller 160, which may be a microprocessor. Tape recorder unit controller 160 is in turn controlled by control signals from controller 110. Under control of controller 110, an on-screen display processor 140 generates character signals, and applies them to a second input of video signal processor 155, respectively, for inclusion in the processed video signal. Signal switch unit 137 is controlled by controller 110 via a control input terminal C to select audio and video signals from audio signal processor 135 and video signal processor 155, or from the output terminals of tape recording unit 165 in the playback mode, and to apply the selected signals to a modulator 139 for modulation onto a particular channel frequency carrier, typically that of channel 3 or channel 4. The portion of the circuitry of FIG. 1 described thus far is known from RCA videocassette recorder model VR520.

Unlike the RCA VR520, which has as its main programming feature a TIMER PROGRAM mode of operation, apparatus according to the subject invention may include both a TIMER PROGRAM programming feature and a VCR PLUS TM programming feature. The control program for the above-mentioned features resides in ROM 114 of controller 110. Electrically-erasable programmable read only memory (EEPROM) 117 is coupled to controller 110, and serves as a nonvolatile storage element for storing autoprogramming channel data, user-entered channel data, and VCR PLUS TM channel mapping data.

An IR LED driver circuit, generally, designated 100, is coupled to controller 110, for providing IR signals to external units, such as a cable box for a cable TV service. IR LED driver circuit comprises a filter capacitor C102, a current-limiting resistor R102, three series-connected IR LEDs (infrared light emitting diodes) D101, D102, and D103, a darlington-connected transistor switch Q101, a base resistor R101, and a speed-up capacitor C101.

Processing unit 130 also produces an IF AGC signal which is coupled to controller 110 via a wire 131, for detection of variation of the signal strength of signals of currently-tuned channels, the changes being indicative of channel changes. Alternatively, video signal processor 155 produces a valid sync detection signal which is coupled to controller 110 via a wire 151, for detection of valid TV sync, changes in the detection of valid TV sync being indicative of channel changes.

It is herein recognized that it is a clear advantage for the unit which contains the VCR PLUS TM control code (in the subject case, the VCR) for controlling the cable box, to be coupled to the television antenna line, so that the controller can determine whether or not the cable box is actually responding to transmitted IR commands. Most cable box IR remote control command formats do not include separate commands for POWER ON and POWER OFF. Rather, it is common practice for cable box manufacturers to program the cable box such that the POWER ON/OFF remote control command is a toggle function. If the command is received while the cable box is "on" then it will turn off. If the command is received while the cable box is "off", then it will turn on. With an "open loop" type of system, such as implemented in the VCR PLUS TM handunit, the controller has no way of knowing if the cable box is "on" or "off". Thus, if the cable box is already "on", the command to turn it "on" in preparation for transmitting it a channel change command will in fact turn the cable box off. As a result, the desired channel change will not be accomplished, and the desired program will not be recorded.

In contrast, apparatus in accordance with the subject invention controls the cable box (i.e., the source of its own video input signals), and monitors the television signals received from the cable box, in a "closed loop" manner. By monitoring the IF AGC signal on line 131 of FIG. 1, controller 110 can detect perturbations of the signal level which indicate that the cable box has changed channels. That is, the output signal of the cable box remodulated on, for example, the RF carrier frequency of channel 3, will be momentarily lost during the period in which the cable box changes channels. Thus, the subject apparatus can determine if the cable box is "off" or "on", and can also determine if a channel change has occurred. It is also recognized that other signals (such as a "Valid Sync Detect" signal or a baseband video AGC signal coupled via line 151 of FIG. 1) can also be monitored to provide this feedback information as to whether commands transmitted to the cable box have actually been received and executed. Advantageously, if a signal which tracks a characteristic of the baseband video signal (such as Valid Sync Detect baseband AGC) is used for detecting loss of signal during channel change, then the subject invention is applicable to use with cable boxes which produce decoded cable television signals at baseband rather than remodulating them to a particular television channel frequency.

The present invention will be further described with reference to FIGS. 2a through 2i, 3a and 3b, and 4.

Figure 2A:
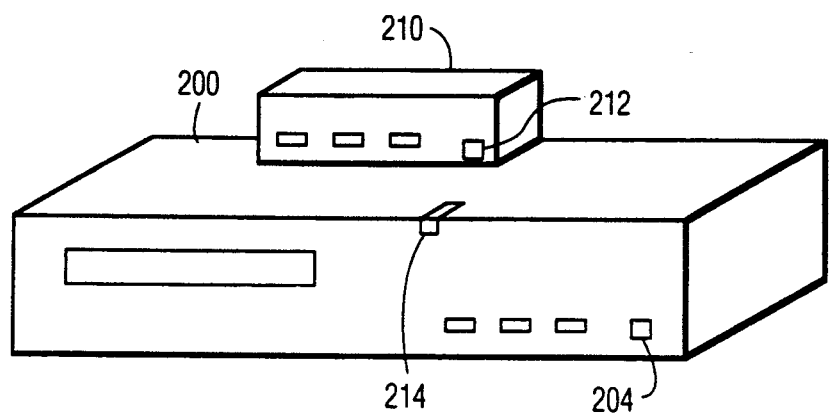
FIGS. 2a and 2b are views of a VCR incorporating the invention.
Figure 2B:
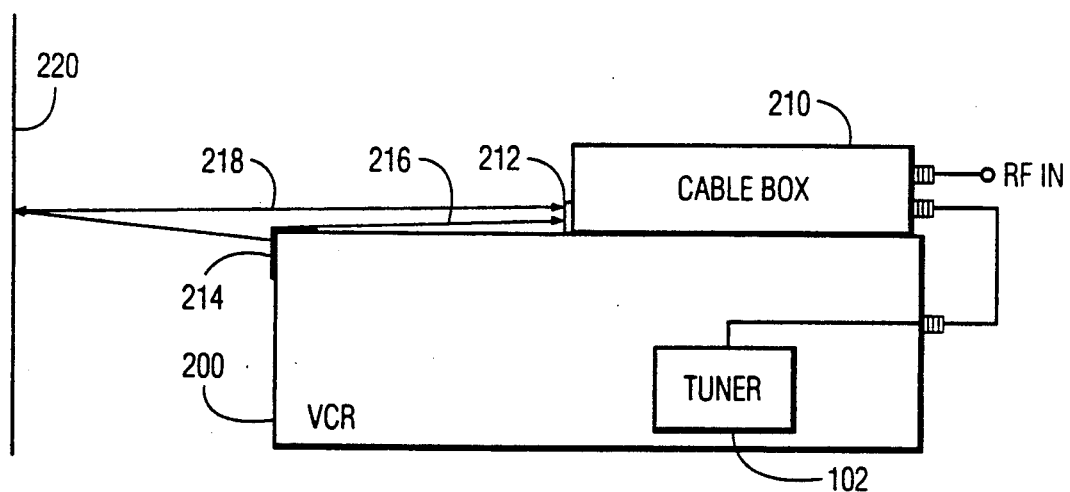

FIG. 2a is a perspective view of a cable box 210 placed on top of a VCR 200. In FIG. 2b, VCR 200 is shown coupled to the RF input via cable box 210. Tuner 102 of FIG. 2b is the same tuner unit 102 previously described with respect to FIG. 1. It is common practice for cable television services to encode (i.e., scramble) at least their "Premium" channels. FIG. 2b is a configuration which may be used when some or all of the television channels provided by the cable television service are encoded in some fashion (i.e., a cable box is required for decoding). In such a configuration, the VCR will be set to record all television programs on the cable box output channel (typically, channel 2, 3, or 4). Cable box 210 of FIGS. 2a and 2b includes a window 212 for admitting an IR (infrared) remote control signal for turning the cable box on and off, and for causing the tuner of the cable box to change channels. VCR 200 of FIG. 2a includes a window 204 for admitting an IR (infrared) remote control signal for turning the VCR on and off, for causing the tuner 102 of the VCR to change channels, and for controlling the recording and playback of videotapes. VCR 200 also includes a window 214 through which IR signals generated by the VCR are transmitted to external units such as cable box 210. Note from FIG. 2b that cable box 210 preferably receives IR signals from window 214 of VCR 200 along a rearward directed path 216, and from a "bounce" path 218 in which the IR signals may be reflected from a wall or other object 220.

FIGS. 2c, 2d, and 2e are pictorial view of an IR LED mounting unit 225. Mounting unit 225 is installed in VCR 200 immediately behind window 214. Mounting unit 225 holds the IR LEDs 230 securely in the proper orientation. It has been found that an arrangement of three IR LEDs as shown (two facing generally forward, and one facing upward) performs well. Mounting unit 225 is preferably made of plastic, and is preferably drilled, or otherwise formed, to include concavities or recesses 235 into which LEDs 230 are placed. In addition to providing a more secure mounting for the LEDs 230, recesses 235 also act as reflectors for the IR light of their respective LED.

FIG. 2f shows a more detailed view of an embodiment of window 214 of FIGS. 2a and 2b. It is recognized herein that alternatively, window 214 may comprise separate orthogonally mounted IR transparent windows, instead of the integral unit shown. Window 214 cooperates with the IR LED mounting assembly of FIGS. 2c, 2d, and 2e as shown in FIG. 2g. The assembly of FIG. 2g provides two IR ports for transmitting an IR bit stream in opposite directions. Note that IR light from the two forward facing LEDs exits through a first port of window 214 along paths 230a. IR light from the upward facing LED is transmitted through a second port of window 214, and reflected rearward by the serrations formed into the upper surface of window 214. The rearward direction of the IR light provides more assurance that the VCR-generated IR commands will reach the cable box. It is important to note that because the "bounce" IR light path 218 is always longer than the direct rearward path 216, more IR power is required to ensure remote control signal reception at the cable box. For this reason, two IR LEDs are directed along the longer bounce path. The two generally forward-facing LEDs may also be angled outward from each other (i.e., along diverging paths) in order to cover more area and increase the chance of reflecting a signal back to the cable box. The "bounce" path is provided for the case in which the user chooses not to place the cable box on top of the VCR.

Instructing the user to place the cable box on top of the VCR as shown in FIGS. 2a and 2b provides a distinct advantage in that this arrangement automatically places the two units in a closely coupled optical relationship, thus facilitating the coupling of IR remote control commands from the VCR to the cable box. This physical relationship of the two units allows a reduction in the number of LEDs as compared to the VCR PLUS TM handunit, because the VCR PLUS TM handunit may be laid down in any orientation with respect to the units to be controlled, and therefore is equipped with an IR LED pointing along each axis. Furthermore, because in the VCR PLUS TM handunit, it cannot be known which axis will be facing the "bounce" path and which will be directly facing the units to be controlled, there can be no provision for increasing the IR power transmitted along the bounce path, as is found in the present invention. It is also noted that the VCR PLUS TM handunit comprises a single printed circuit (PC) board extending throughout its plastic enclosure, and is therefore amenable to mounting an LED directly to the PC board at each side of the device. The arrangement of FIG. 2g is therefore more advantageous because, in the case of a VCR, a PC board seldom extends throughout the enclosure, so that additional cabling, mounting hardware, and assembly steps would be required to mount LEDs at each side of the VCR to point along each axis. It should be noted that the dotted arrows 230a and 230b of FIG. 2g are simplified depictions of the IR light path. In reality, the light exiting the surfaces of window 214 are substantially cone shaped. Thus, even though dotted arrow 214 is refracted slightly upward upon exiting the top surface of window 214, the actual cone shape of the IR light emission nevertheless conveys substantial light energy in a generally rearward direction.

Figure 2H:
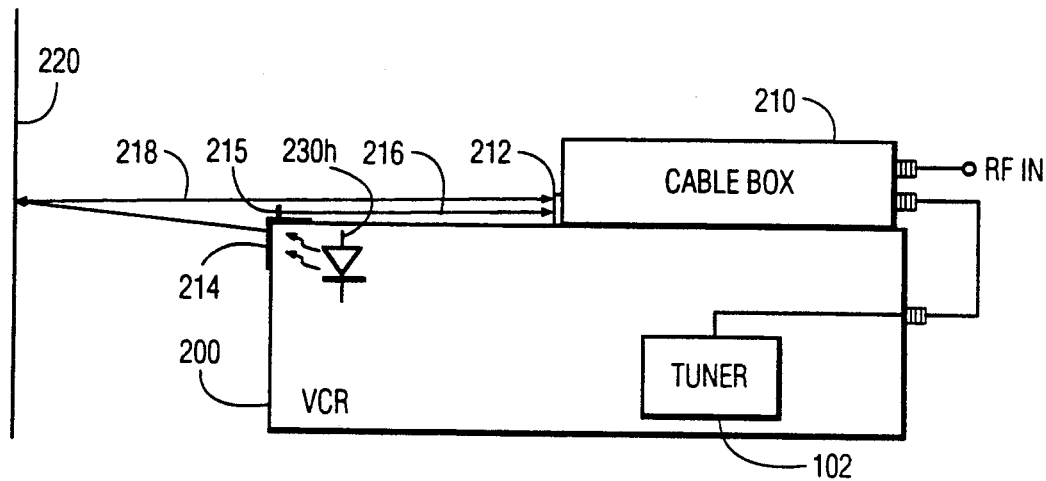
FIGS. 2h and 2i show alternative embodiments of an IR LED assembly.
Figure 2I:
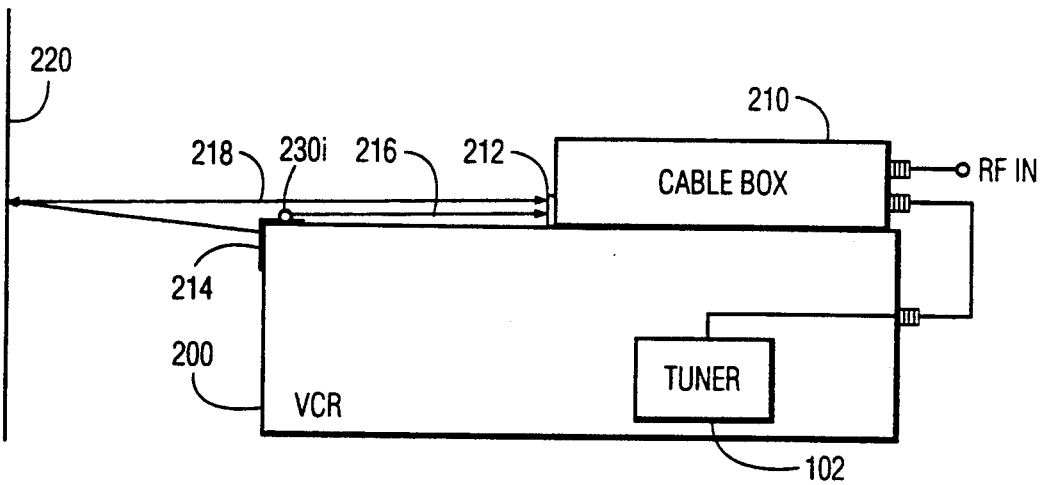

Referring to FIG. 2h, it is also recognized herein, that a mirror 215 may be employed to direct the IR stream from an upward-facing LED 230h rearward instead of using the serrations of window 214. Alternatively, the upward facing LED 230i may be extended through the cabinet of VCR 200 and aimed generally rearward, as shown in FIG. 2i.

Figure 3A:
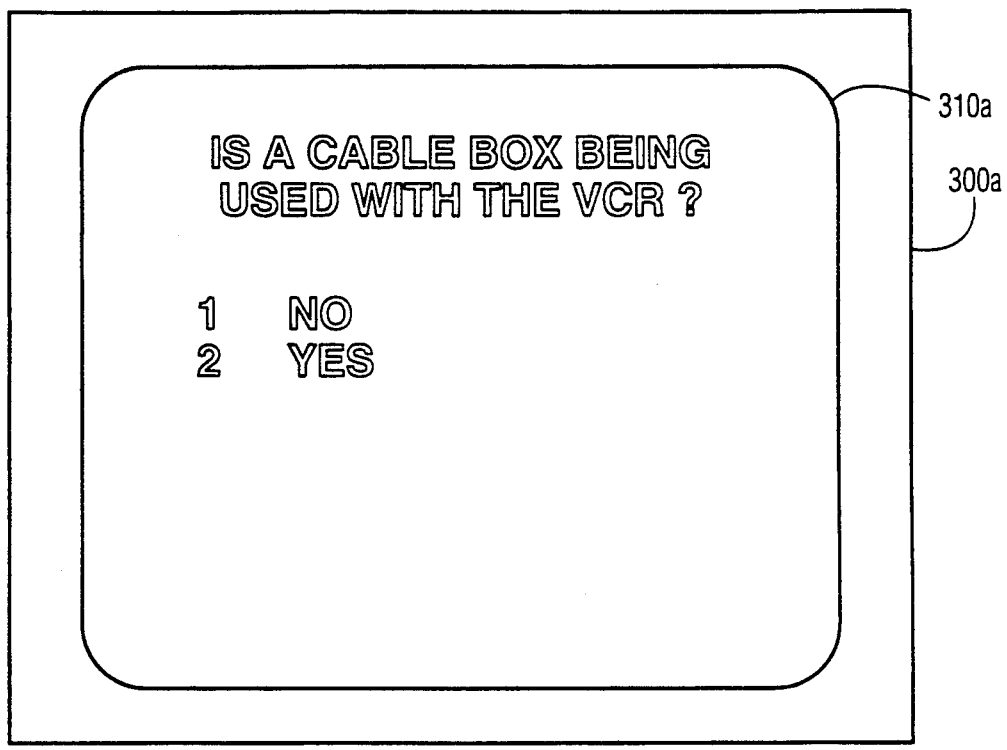
FIGS. 3a and 3b are illustrations of display screens generated in accordance with the invention.
Figure 3B:
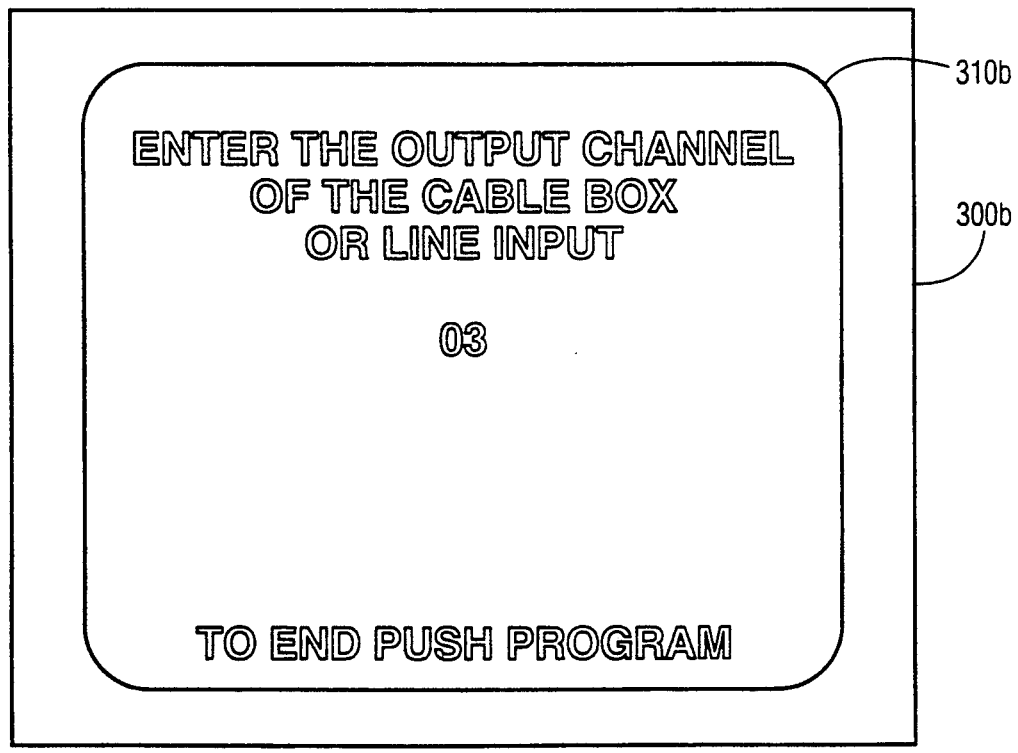
Figure 4:
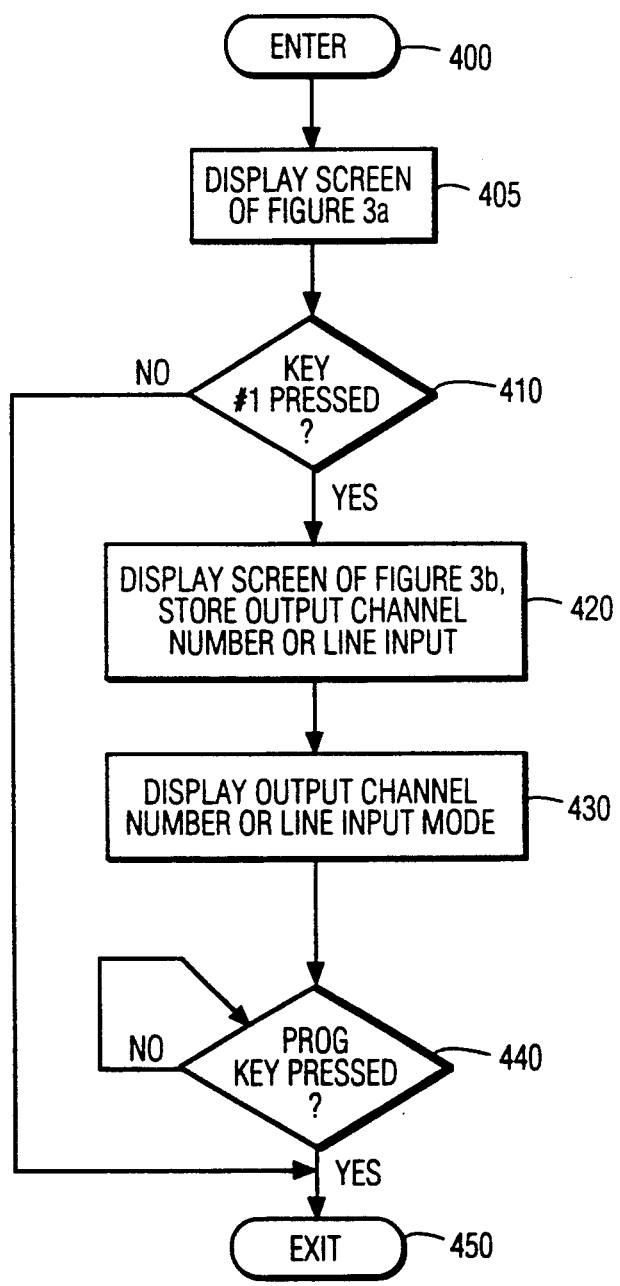
FIG. 4 is a flowchart showing a portion of the control program of the controller of FIG. 1.

With respect to FIGS. 3a and 3b, assume that a VCR according to the present invention is coupled to a television set 300a-300b, having a picture tube 310a-310b, respectively. FIG. 3a shows a display screen displayed during a VCR SET-UP mode of operation. A portion of the set-up procedure for the configuration of FIG. 2b is shown in FIG. 4, and is as follows. During the SET-UP procedure, the screen of FIG. 3a appears (step 400 and 405). At step 410, if key 1 is pressed it means that the user has a cable television service which does not require a cable box. In that case, the routine is exited (step 450). If at step 410 key 2 was pressed, it means that the user has a cable box. In that case, the screen of FIG. 3b is displayed, (it is to be understood that the "03" is the output channel of the cable box, and is entered by the user), and the output channel information is stored (step 420 and step 430). If key 2 were entered from screen 3b, it means that all channels are received via the cable box (i.e., the configuration of FIG. 2b), and therefore the cable box output channel will automatically be substituted for all channels programmed whether entered via the VCR PLUS TM codes or directly via the TIMER program. It is noted that the "cable box output channel" could in fact be a baseband VIDEO OUT terminal of a cable box, in which case the VCR's VIDEO IN terminal would automatically be considered as receiving the signal of the "cable box output channel".

Although the VCR PLUS TM system is referred to in the subject specification, it is herein recognized that the subject invention does not require the use of the VCR PLUS TM system and is extremely useful with standard timer recording.

What is claimed is:
1. A videocassette recorder, comprising:
a television signal input terminal, for receiving a television signal;
control means for generating a control signal;
means, coupled to said control means, for entering data in response to operation by a user; and
means coupled to said control means for transmitting a remote control signal for controlling an external source of said television signal; and
means for detecting an active television signal, said detecting means receiving said television signal, and in response to the detection of a predetermined characteristic of said television signal generates a signal indicative of an active television signal and applies said indicative signal to said control means; said control means in response to data entered by said user generates said remote control signals and applies said remote control signals to said remote control signal transmitting means and monitors said indicative signal as a feedback signal.

2. The videocassette recorder of claim 1, wherein said means for transmitting is an IR LED assembly, and said remote control signals are IR signals.

3. The videocassette recorder of claim 1, wherein said means for detecting is an automatic gain control (AGC) circuit, and said signal indicative of an active television signal is an AGC signal.

4. The videocassette recorder of claim 1, wherein said means for detecting is a valid television synchronizing signal detection circuit, and said signal indicative of an active television signal is a signal indicative of the detection of a valid television synchronizing signal.

5. The videocassette recorder of claim 1, further comprising:
means for storing data corresponding to said commands for controlling said television signal source, said storing means being coupled to said control means.

* * * * *